(12) United States Patent
Bai et al.

(10) Patent No.: US 12,211,889 B2
(45) Date of Patent: Jan. 28, 2025

(54) ELECTRODE LAYER, CAPACITOR AND METHODS FOR ELECTRODE LAYER AND CAPACITOR MANUFACTURE

(71) Applicant: CHANGXIN MEMORY TECHNOLOGIES, INC., Hefei (CN)

(72) Inventors: Weiping Bai, Hefei (CN); Mengkang Yu, Hefei (CN); Xingsong Su, Hefei (CN); Zhen Zhou, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 610 days.

(21) Appl. No.: 17/401,489

(22) Filed: Aug. 13, 2021

(65) Prior Publication Data

US 2022/0216297 A1 Jul. 7, 2022

Related U.S. Application Data (63) Continuation of application No. PCT/CN2021/103494, filed on Jun. 30, 2021.

(30) Foreign Application Priority Data

Jan. 5, 2021 (CN) .......................... 202110009808.6

(51) Int. Cl.
  *H01L 21/44* (2006.01)
  *H01L 49/02* (2006.01)
(52) U.S. Cl.
  CPC .................................. *H01L 28/75* (2013.01)
(58) Field of Classification Search
  None
  See application file for complete search history.

(56) References Cited

U.S. PATENT DOCUMENTS

| | | | |
|---|---|---|---|
| 7,029,985 B2 | 4/2006 | Basceri | |
| 7,164,165 B2 | 1/2007 | Basceri | |
| 7,323,738 B2 | 1/2008 | Basceri | |
| 7,326,984 B2 | 2/2008 | Basceri | |
| 8,815,695 B2 | 8/2014 | Rui et al. | |
| 8,828,821 B2 | 9/2014 | Chen | |
| 8,847,397 B2 | 9/2014 | Malhotra et al. | |
| 9,224,878 B2 | 12/2015 | Malhotra et al. | |
| 10,593,777 B2 | 3/2020 | Kim | |

(Continued)

FOREIGN PATENT DOCUMENTS

| | | |
|---|---|---|
| CN | 107868944 A | 4/2018 |
| CN | 110718538 A | 1/2020 |
| CN | 112071981 A | 12/2020 |

OTHER PUBLICATIONS

Wo et al. "Effects of TiN sublayers on the response of TiSiN nanocomposite coatings to nanoidentation and scratching contacts" Materials Science and Engineering A 527 (2010) 4447-4457. (Year: 2010).*

*Primary Examiner* — Xiaoming Liu
(74) *Attorney, Agent, or Firm* — Syncoda LLC; Feng Ma (57) ABSTRACT

The application relates to an electrode layer, a capacitor and methods for electrode layer and capacitor manufacture. The method for electrode layer manufacture comprises the following steps: forming a first electrode layer, the first electrode layer comprising a doped Titanium Nitride (TiN) layer; and forming a second electrode layer on the surface of the first electrode layer, the second electrode layer comprising a TiN layer or a work function layer.

13 Claims, 10 Drawing Sheets

(56) References Cited

U.S. PATENT DOCUMENTS

| | | |
|---|---|---|
| 2003/0213987 A1 | 11/2003 | Basceri |
| 2004/0046197 A1 | 3/2004 | Basceri |
| 2006/0244027 A1 | 11/2006 | Basceri |
| 2007/0122967 A1* | 5/2007 | Lee .................. H01L 28/40 438/239 |
| 2007/0138529 A1 | 6/2007 | Basceri |
| 2008/0081380 A1* | 4/2008 | Celii .................. H01L 28/75 257/E21.001 |
| 2012/0171839 A1 | 7/2012 | Chen |
| 2014/0183696 A1 | 7/2014 | Rui et al. |
| 2014/0183697 A1 | 7/2014 | Malhotra et al. |
| 2014/0187015 A1 | 7/2014 | Rui et al. |
| 2014/0187016 A1 | 7/2014 | Malhotra et al. |
| 2019/0267383 A1 | 8/2019 | Rocklein et al. |
| 2020/0020780 A1 | 1/2020 | Kim |
| 2020/0168717 A1 | 5/2020 | Kim |
| 2020/0395436 A1 | 12/2020 | Jung et al. |

* cited by examiner

ELECTRODE LAYER, CAPACITOR AND METHODS FOR ELECTRODE LAYER AND CAPACITOR MANUFACTURE

CROSS-REFERENCE TO RELATED APPLICATION

The application is a continuation of International Application No. PCT/CN2021/103494, filed on Jun. 30, 2021, which is based upon and claims priority to Chinese Patent Application No. 202110009808.6, filed on Jan. 5, 2021 and entitled "Electrode Layer, Capacitor and Methods for Electrode Layer and Capacitor Manufacture". The contents of International Application No. PCT/CN2021/103494 and Chinese Patent Application No. 202110009808.6 are incorporated herein by reference in their entireties.

TECHNICAL FIELD

The disclosure relates to the technical field of integrated circuits, and particularly, to an electrode layer, a capacitor and methods for the electrode layer and capacitor manufacture.

BACKGROUND

Dynamic Random Access Memory (DRAM) is a commonly used semiconductor storage device in computers, and includes many repetitive storage cells. Each of the storage cells usually includes a capacitor and a transistor. A gate electrode of the transistor is connected with a word line, a drain electrode of the transistor is connected with a bit line, and a source electrode of the transistor is connected with the capacitor. Voltage signals on the word line may control the transistor to be turned on or turned off, so that the data information stored in the capacitor may be read through the bit line, or the data information may be written into the capacitor through the bit line for storage. In a manufacturing process of a DRAM capacitor at present, a Titanium Nitride (TiN) material is used as a material of a Storage Node (SN) because of good heat stability, good compatibility with a high-K dielectric layer and better mechanical strength.

With the further miniaturization of the DRAM technology to an advanced node, the depth-to-width ratio on a capacitive structure is greatly increased. Especially, the structure of the capacitor is evolved to a columnar structure from a cylindrical structure, because the mechanical strength of TiN is not high enough, the capacitive structure easily collapses due to stress.

SUMMARY

In a first aspect, the disclosure provides a method for electrode layer manufacture. The method includes the following steps: forming a first electrode layer, the first electrode layer includes a doped TiN layer, and forming a second electrode layer on the surface of the first electrode layer, the second electrode layer includes a TiN layer or a work function layer.

In a second aspect, the disclosure further provides an electrode layer. The electrode layer includes: a first electrode layer including a doped TiN layer, and a second electrode layer located on the surface of the first electrode layer and including a TiN layer or a work function layer.

In a third aspect, the disclosure further provides a method for manufacturing a capacitor. The method includes the following steps: forming a lower electrode layer on the side wall and the bottom of a capacitive hole, the lower electrode layer is manufactured by adopting the above mentioned method for electrode layer manufacture; forming a capacitive dielectric layer on the inside surface and the outside surface of the lower electrode layer, and forming an upper electrode layer on the surface of the capacitive dielectric layer.

In a fourth aspect, the disclosure further provides a capacitor. The capacitor includes: a lower electrode layer including the above mentioned electrode layer, a capacitive dielectric layer located on the inside surface and the outside surface of the lower electrode layer, and an upper electrode layer located on the surface of the capacitive dielectric layer.

In a fifth aspect, the disclosure further provides a method for manufacturing a capacitor. The method includes the following steps: forming a lower electrode layer in a capacitive hole, the lower electrode layer fully fills in the capacitive hole and is manufactured by adopting the above mentioned method for the electrode layer manufacture; forming a capacitive dielectric layer on the outside surface of the lower electrode layer; and forming an upper electrode layer on the outside surface of the capacitive dielectric layer.

In a sixth aspect, the disclosure further provides a capacitor. The capacitor includes: a lower electrode layer including a solid columnar structure and including the above mentioned electrode layer, a capacitive dielectric layer located on the outside surface of the lower electrode layer, and an upper electrode layer located on the outside surface of the capacitive dielectric layer.

Details of the various embodiments of the disclosure will be described in drawings and descriptions below. According to records of description, drawings and claims, those skilled in the art will easily understand other features, solved problems and beneficial effects of the disclosure.

BRIEF DESCRIPTION OF THE DRAWINGS

In order to describe the technical solutions in the embodiments of the disclosure or a conventional art more clearly, the drawings required to be used in descriptions about the embodiments or the conventional art will be simply introduced below. It is apparent that the drawings described below are only some embodiments of the disclosure. Other drawings may further be obtained by those of ordinary skilled in the art according to these drawings without involving any inventive efforts.

DETAILED DESCRIPTION

In order to make the disclosure convenient to understand, the disclosure will be described more comprehensively below with reference to the related drawings. The drawings illustrate preferred embodiments of the disclosure. However, the disclosure may be implemented in various forms and is not limited to the embodiments described herein. Instead, these embodiments are provided to make the contents disclosed in the disclosure understood more thoroughly and comprehensively.

Unless otherwise defined, all technical and scientific terms used herein have the same meanings as commonly understood by those skilled in the art that the disclosure belongs to. Herein, terms used in the description of the disclosure are only for the purpose of describing specific embodiments and not intended to limit the disclosure.

It should be understood that description that an element or layer is "above", "adjacent to", "connected to", or "coupled to" another element or layer may refer to that the element or layer is directly above, adjacent to, connected to or coupled to the other element or layer, or there may be an intermediate element or layer. On the contrary, description that an element is "directly on", "directly adjacent to", "directly connected to" or "directly coupled to" another element or layer refers to that there is no intermediate element or layer. It should be understood that, although various elements, components, regions, layers, doping types and/or parts may be described with terms first, second, etc., these elements, components, regions, layers, doping types and/or parts should not be limited to these terms. These terms are used only to distinguish one element, component, region, layer, doping type or part from another element, component, region, layer, doping type or part. Therefore, a first element, component, region, layer, doping type or part discussed below may be represented as a second element, component, region, layer or part without departing from the teaching of the disclosure. For example, a first electrode layer may be called as a second electrode layer, similarly, the second electrode layer may be called as a first electrode layer, and the first electrode layer and the second electrode layer are different electrode layers.

Spatially relational terms such as "below", "under", "lower", "beneath", "above", and "upper" may be used herein for describing a relationship between one element or feature and another element or feature illustrated in the figures. It should be understood that, in addition to the orientation illustrated in the figures, the spatially relational terms further include different orientations of devices in use and operation. For example, if the devices in the figures are turned over, elements or features described as being "under" or "beneath" or "below" other elements or features will be oriented to be "on" the other elements or features. Therefore, the embodiment terms "under" and "below" may include both upper and lower orientations. Moreover, the device may include other orientations (such as rotation by 90 degrees or in other orientations) and the spatial descriptors used herein may be interpreted accordingly.

As used herein, singular forms "a/an", "one", and "the/said" may include the plural forms, unless otherwise specified types in the context. It should further be understood that, when terms "composed of" and/or "including" are used in this specification, the presence of the features, integers, steps, operations, elements, and/or components may be determined, but the presence or addition of one or more other features, integers, steps, operations, elements, components, and/or groups is also possible. Meanwhile, as used herein, term "and/or" includes any and all combinations of the related listed items.

Referring to a cross section diagram of a schematic diagram of an ideal embodiment (and an intermediate structure) of the disclosure herein, embodiments of the disclosure are described, so that change of shown shapes due to a manufacturing technology and/or tolerance may be predicted. Therefore, the embodiments of the disclosure should not be limited to specific shapes of illustrated regions, but including shape deviation due to the manufacturing technology. Therefore, regions illustrated in the figures are schematic substantially, their shapes do not represent actual shapes of regions of a device, and there is no limitation on the scope of the disclosure.

Figure 1:
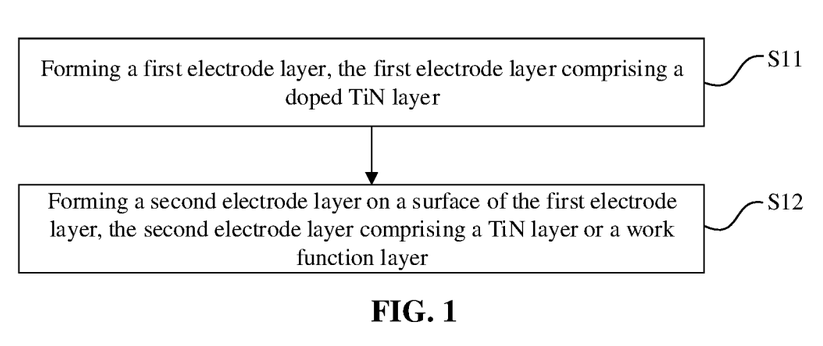
FIG. 1 is a flowchart of a method for electrode layer manufacture provided in an embodiment of the disclosure.
Figure 2:
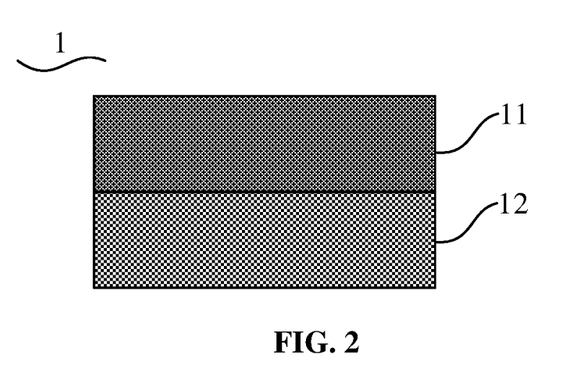
FIG. 2 is a structural schematic diagram of a section of an electrode layer provided in an embodiment of the disclosure.

Referring to FIG. 1 and FIG. 2, the disclosure provides a method for electrode layer manufacture. The method for electrode layer 1 manufacture may include steps Sll and S12.

At S11, a first electrode layer 11 is formed, and the first electrode layer 11 includes a doped TiN layer.

At S12, a second electrode layer 12 is formed on the surface of the first electrode layer 11, and the second electrode layer 12 includes a TiN layer or a work function layer.

In an embodiment, the manufactured second electrode layer 12 may be a TiN layer. At this case, the electrode layer 1 is a laminated structure including the doped TiN layer and the TiN layer which are laminated. Compared with the TiN layer, the doped TiN layer has more than two times of mechanical strength, moreover, the electrode layer 1 is a laminated structure including the first electrode layer 11 and the second electrode layer 12, so that the mechanical strength of the electrode layer 1 may be obviously increased, and collapse due to stress may be avoided when the electrode layer 1 is used as a lower electrode layer of a capacitor. However, introduction of the doped TiN layer may cause the electrical resistivity of the electrode layer 1 to be greatly increased compared with the electrical resistivity of a single TiN layer, so that the conductivity of the electrode layer is influenced.

In another embodiment, the manufactured second electrode layer 12 may be a work function layer. At this case, the electrode layer 1 is a laminated structure including the doped TiN layer and the work function layer which are laminated. Compared with the TiN layer, the doped TiN layer has more than two times of mechanical strength, moreover, the electrode layer 1 is a laminated structure including the first electrode layer 11 and the second electrode layer 12, so that the mechanical strength of the electrode layer 1 may be obviously increased, and collapse due to stress may be avoided when the electrode layer 1 is used as the lower electrode layer of the capacitor. Meanwhile, because the electrode layer 1 includes the work function layer, the electrical resistivity of the electrode layer may be reduced due to existence of the work function layer, and the conductive performance of the electrode layer is improved. The requirements of the electrode layer 1 may be met in the aspects of an effective work function and the interface compatibility with a dielectric layer, electric leakage is reduced, and the capacitance value is increased.

Figure 3:
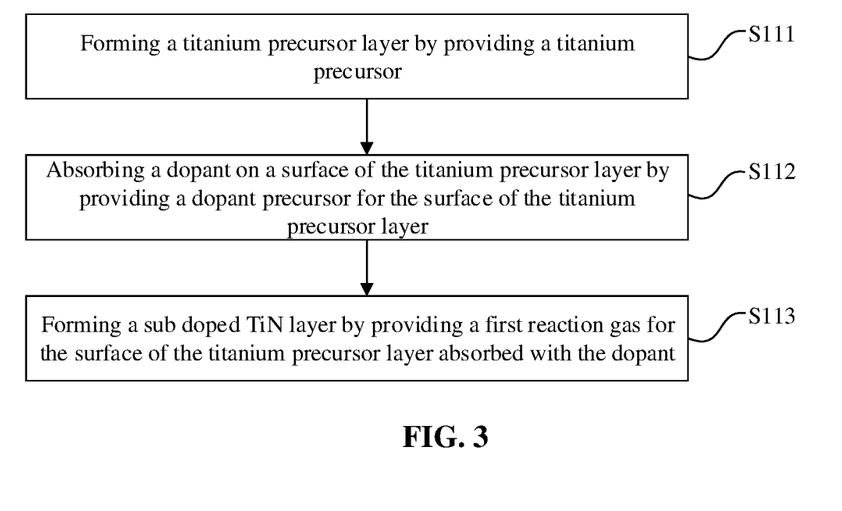
FIG. 3 is a flowchart of a doped TiN growth period in a method for electrode layer manufacture provided in an embodiment of the disclosure.

For the step S11, in an embodiment, the first electrode layer 11 is formed by adopting an atomic layer deposition process in the step S11. The process of forming the first electrode layer 11 by adopting the atomic layer deposition process may include at least one doped TiN growth period. Referring to FIG. 3, the doped TiN growth period may include steps S111 to S113.

At S111, a titanium precursor layer is formed by providing a titanium precursor. Specifically, the first electrode layer 11 may be formed on the inner wall of a capacitive hole. At this case, the titanium precursor may be provided into the capacitive hole, so that the titanium precursor is formed on the inner wall of the capacitive hole.

At S112, a dopant is absorbed on the surface of the titanium precursor layer by providing a dopant precursor for the surface of the titanium precursor layer.

At S113, a sub doped TiN layer is formed by providing a first reaction gas for the surface of the titanium precursor layer absorbed with the dopant.

In the method for electrode layer manufacture provided by the above embodiments, after the titanium precursor layer is formed, the dopant precursor is introduced, so that the dopant is absorbed on the surface of the titanium precursor layer. Then, the first reaction gas is introduced, because there are only a litter dopant precursor attached to the surface by filling the gap between atoms of an atom coverage layer of the titanium precursor, each titanium precursor layer may generate a sub doped TiN layer in which the dopant is minimally doped. In the process, the dopant may be distributed in the whole sub doped TiN layer more uniformly, so that the uniform doping purpose can be achieved.

In an embodiment, a cleaning step is further included between the step S111 and step S112, between the step S112 and the step S113 and after the step S113 respectively. Specifically, cleaning gas may be introduced into the capacitive hole so as to remove redundant titanium precursors, redundant dopant precursors and redundant first reaction gas, so that cleaning is achieved. The cleaning gas may include, but is not limited to, nitrogen or inert gas.

In an embodiment, the titanium precursor may include, but is not limited to, titanium tetrachloride ($TiCl_4$), and the kind of the titanium precursor is not limited by the embodiment.

In an embodiment, the dopant precursor may include, but not limited to, dichlorosilane (DCS), silane ($SiH_4$), tetra-dimethylaminosilane ($SiH(NMe_2)_3$, TDMAS) or their combinations, and the kind of the dopant precursor is not limited by the embodiment.

In an embodiment, the first reaction gas may include, but not limited to, at least one of ammonia gas ($NH_3$), nitric oxide (NO), nitrous oxide ($N_2O$) or nitrogen (N2), and the specific kind of the first reaction gas is not limited by the embodiment.

Figure 4:
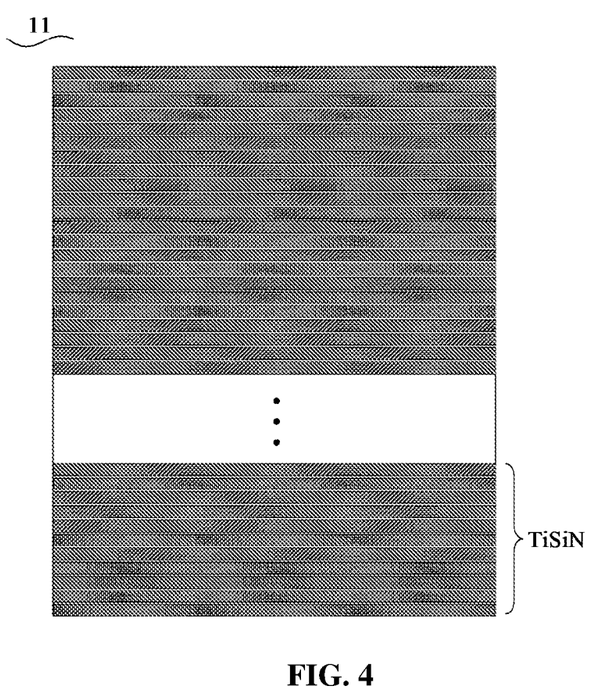
FIG. 4 to FIG. 6 are structural schematic diagrams of a first electrode layer formed by an atomic layer deposition process in methods for electrode layer manufacture provided in different embodiments of the disclosure.

In an embodiment, referring to FIG. 4, the process of forming the first electrode layer 11 by adopting the atomic layer deposition process may include multiple doped TiN growth periods. That is, the formed first electrode layer 11 may include multiple sub doped TiN layers which are superposed in sequence. The specific number of the doped TiN growth periods may be set according to requirements, and there is no limitation at this case. For example, the process of forming the first electrode layer 11 may include 2 to 200 doped TiN growth periods, and specifically, may include 2, 10, 20, 30, 40, 50, 60, 70, 80, 90, 100 or even more doped TiN growth periods.

Figure 5:
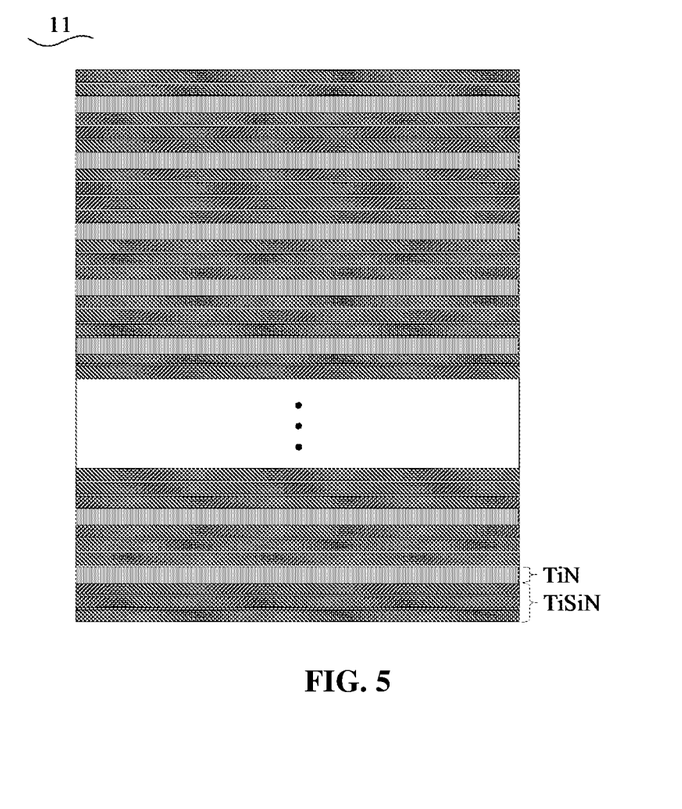
Figure 6:
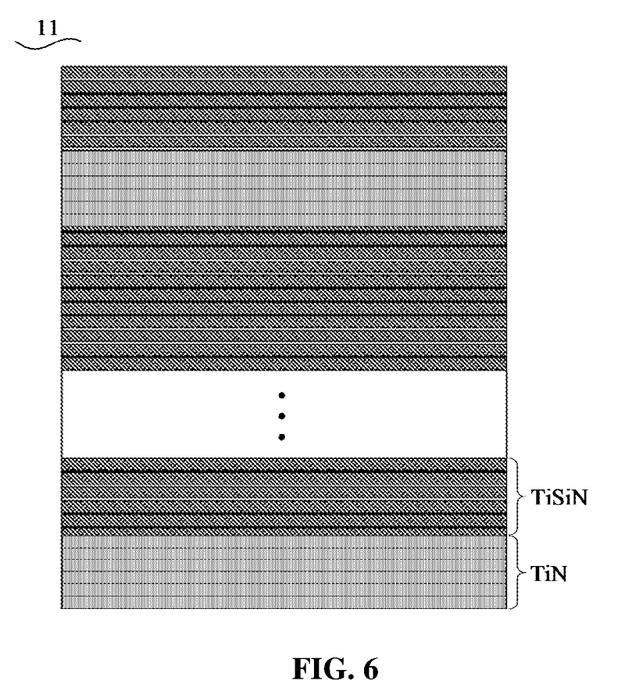

In another embodiment, referring to FIG. 5 and FIG. 6, a step of forming at least one TiN layer by adopting the atomic layer deposition process is further included before the first doped TiN growth period, and/or before the last doped TiN growth period, and/or between at least two adjacent doped TiN growth periods. That is, the first electrode layer 11 is a laminated structure including multiple sub doped TiN layers and at least one TiN layer. Herein, in FIG. 5, the first electrode layer 11 includes multiple TiN layers which are arranged at intervals, and multiple sub doped TiN layers are arranged between the adjacent TiN layers. In FIG. 6, the first electrode layer 11 includes multiple sub doped TiN layer lamination structures formed by multiple sub doped TiN layers in a superposition manner in sequence and multiple TiN layer lamination structures formed by multiple TiN layers in a superposition manner in sequence. The TiN layer lamination structures and the sub doped TiN layer lamination structures are alternately superposed in sequence. The operation that the TiN layer is formed by adopting the atomic layer deposition process includes the following operations.

A titanium precursor layer is formed on the surface of the sub doped TiN layer by providing a titanium precursor for the surface of the sub doped TiN layer.

The TiN layer is formed by providing the first reaction gas for the surface of the titanium precursor layer.

In the method for electrode layer manufacture provided by the above embodiments, the first electrode layer 11 with required thickness is generated by repetitive deposition of the sub doped TiN layers, so that the dopant may be distributed in the whole first electrode layer 11 more uniformly in the deposition process, and the uniform doping purpose can be achieved.

In an embodiment, a cleaning step is further included after the titanium precursor layer is formed, before the first reaction gas is provided and after the TiN layer is formed, respectively. Specifically, cleaning gas may be introduced to the surface of the sub doped TiN layer so as to remove redundant titanium precursors and redundant first reaction gas, so that cleaning is achieved. The cleaning gas may include, but is not limited to, nitrogen or inert gas.

In an embodiment, the content of the dopant may be properly adjusted and controlled in a low doping range of the required dopant by adjusting the proportion and the sequence of the doped TiN growth period and the TiN layer. The proportion and the sequence of the doped TiN growth period and the TiN layer are not limited by the embodiment. Herein, the low doping range of the dopant is 1%-10%, specifically 3%, 5%, 7% and the like, and the doping content of the dopant is not limited by the embodiment.

Specifically, in an embodiment, the dopant in the doped TiN layer may include at least one of: silicon, boron, aluminum, zirconium, hafnium, phosphorus, carbon, gallium, germanium, antimony, tellurium, arsenic and tungsten. In the present embodiment, the dopant is silicon.

Figure 7:
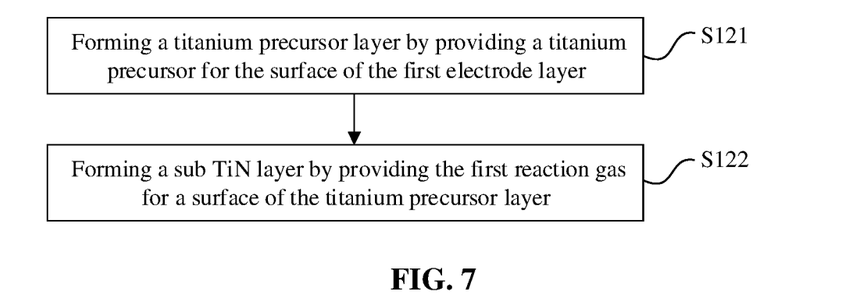
FIG. 7 is a flowchart of a TiN growth period in a method for electrode layer manafacture provided in an embodiment of the disclosure.

For step S12, in an embodiment, the second electrode layer 12 is formed by adopting the atomic layer deposition process in S12. When the second electrode layer 12 is a TiN layer, the process of forming the second electrode layer 12 by adopting the atomic layer deposition process may include at least one TiN growth period. Referring to FIG. 7, the TiN growth period may include the following steps.

A titanium precursor layer is formed by providing a titanium precursor for the surface of the first electrode layer 11.

A sub TiN layer is formed by providing the first reaction gas for the surface of the titanium precursor layer.

In an embodiment, a cleaning step is further included after the titanium precursor layer is formed, before the first reaction gas is provided and after the TiN layer is formed, respectively. Specifically, cleaning gas may be introduced to the surface of the sub doped TiN layer so as to remove redundant titanium precursors and redundant first reaction gas, so that cleaning is achieved. The cleaning gas may include, but is not limited to, nitrogen or inert gas.

For step S12, in an embodiment, the second electrode layer 12 is formed by adopting the atomic layer deposition process in S12. When the second electrode layer 12 is a work function layer, the work function layer includes a ruthenium layer or a ruthenium oxide layer. The process of forming the second electrode layer 12 by adopting the atomic layer deposition process may include at least one work function growth period. The work function growth period may include the following operations.

A ruthenium precursor layer is formed by providing a ruthenium precursor for the surface of the first electrode layer 11.

A sub work function layer is formed by providing a second reaction gas for the surface of the ruthenium precursor layer.

In an embodiment, a cleaning step is further included after the ruthenium precursor layer is formed, before the second reaction gas is provided and after the sub work function layer is formed, respectively. Specifically, cleaning gas may be introduced to the surface of the first electrode layer 11 so as to remove redundant ruthenium precursors and redundant second reaction gas, so that cleaning is achieved. The cleaning gas may include, but is not limited to, nitrogen or inert gas.

In an embodiment, the ruthenium precursor may include, but is not limited to, ruthenium trichloride (RuCl$_3$). The kind of the ruthenium precursor is not limited by the embodiment.

specifically, the layer number of the first electrode layer 11 and the layer number of the second electrode layer 12 included in the electrode layer 1 may be set according to actual requirements, and there is no limitation here. For example, the layer number of the first electrode layer 11 and the layer number of the second electrode layer 12 in the electrode layer 1 may be one as illustrated in FIG. 2. Certainly, in other embodiments, after step S12, the method may further include: reperforming S 11and S12 for at least one time, so that at least one of the layer number of the first electrode layers 11 or the layer number of the second electrode layers 12 in the formed electrode layer 1 may be multiple layers. At this case, the first electrode layers 11 and the second electrode layers 12 are alternately superposed in sequence.

It should be understood that the order of S11 and S12 may be interchangeable in other embodiments. That is, in other embodiments, the second electrode layer is formed on the inner wall of the capacitive hole at first, and then the first electrode layer is formed on the surface of the second electrode layer.

Continuously referring to FIG. 2 to FIG. 6, the disclosure further provides an electrode layer 1. The electrode layer 1 includes a first electrode layer 11 and a second electrode layer 12.

The first electrode layer 11 includes a doped TiN layer.

The second electrode layer 12 is located on the surface of the first electrode layer 11, and the second electrode layer 12 includes a TiN layer or a work function layer.

In an embodiment, the second electrode layer 12 may be a TiN layer. At this case, the electrode layer 1 is a laminated structure including a doped TiN layer and a TiN layer which are laminated. Compared with the TiN layer, the doped TiN layer has more than two times of mechanical strength, moreover, the electrode layer 1 is a laminated structure including the first electrode layer 11 and the second electrode layer 12, so that the mechanical strength of the electrode layer 1 may be obviously increased, and collapse due to stress may be avoided when the electrode layer 1 is used as a lower electrode layer of a capacitor. However, introduction of the doped TiN layer may cause the electrical resistivity of the electrode layer 1 to be greatly increased compared with the electrical resistivity of a single TiN layer, so that the conductivity of the electrode layer is influenced.

In another embodiment, the second electrode layer 12 may be a work function layer. At this case, the electrode layer 1 is a laminated structure including the doped TiN layer and the work function layer which are laminated. Compared with the TiN layer, the doped TiN layer has more than two times of mechanical strength, moreover, the electrode layer 1 is a laminated structure including the first electrode layer 11 and the second electrode layer 12, so that the mechanical strength of the electrode layer 1 may be obviously increased, and collapse due to stress may be avoided when the electrode layer 1 is used as the lower electrode layer of the capacitor. Meanwhile, because the electrode layer 1 includes the work function layer, the electrical resistivity of the electrode layer may be reduced due to existence of the work function layer, the conductive performance of the electrode layer is improved, requirements of the electrode layer 1 in the aspects of an effective work function and the interface compatibility with a dielectric layer may be met, electric leakage is reduced, and the capacitance value is increased.

Specifically, in an embodiment, referring to FIG. 4, the first electrode layer 11 includes multiple sub doped TiN layers which are superposed in sequence.

In another embodiment, referring to FIG. 5, the first electrode layer 11 includes multiple TiN layers which are arranged at intervals, and multiple sub doped TiN layers are arranged between adjacent TiN layers.

In another embodiment, referring to FIG. 6, the first electrode layer 11 includes multiple sub doped TiN layer lamination structures formed by multiple sub doped TiN layers in a superposition manner in sequence and multiple TiN layer lamination structures formed by multiple TiN layers in a superposition manner in sequence, and the TiN layer lamination structures and the sub doped TiN layer lamination structures are alternately superposed in sequence.

The content of the dopant may be properly adjusted and controlled in a low doping range of the required dopant by adjusting the proportion and the sequence of the doped TiN growth period and the TiN layer. The proportion and the sequence of the doped TiN growth period and the TiN layer are not limited by the embodiment.

Specifically, in an embodiment, the dopant in the doped TiN layer includes at least one of: silicon, boron, aluminum, zirconium, hafnium, phosphorus, carbon, gallium, germanium, antimony, tellurium, arsenic and tungsten.

In an embodiment, the second electrode layer 12 includes multiple TiN layers superposed in sequence or multiple work function layers superposed in sequence.

Specifically, in an embodiment, the work function layer includes a ruthenium layer or a ruthenium oxide layer.

In an embodiment, the electrode layer is a laminated structure. Specifically, the layer number of the first electrode layers 11 and the layer number of the second electrode layers 12 included in the electrode layer 1 may be set according to actual requirements, and there is no limitation here. For example, the layer number of the first electrode layer 11 and the layer number of the second electrode layer 12 in the electrode layer 1 may be one as illustrated in FIG. 2. Certainly, in other embodiments, at least one of the layer number of the first electrode layers 11 or the layer number of the second electrode layers 12 in the electrode layer 1 may be multiple layers. At this case, the first electrode layers 11 and the second electrode layers 12 are alternately superposed in sequence.

Figure 8:
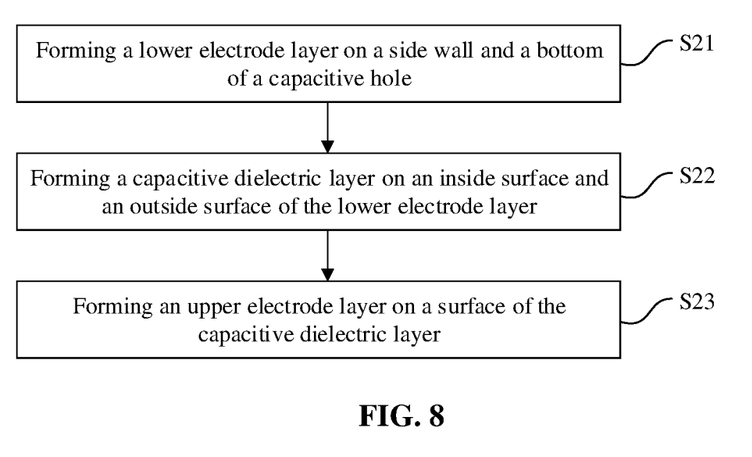
FIG. 8 is a flowchart of a method for manufacturing a capacitor provided in an embodiment of the disclosure.
Figure 9:
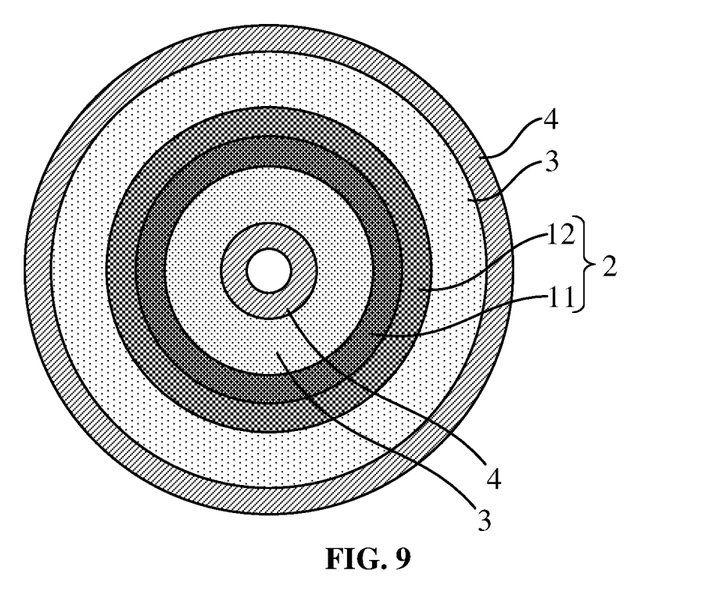
FIG. 9 is an overhead schematic structural diagram of a capacitor manufactured by the method for manufacturing the capacitor in FIG. 8.

Referring to FIG. 8 and FIG. 9, the disclosure further provides a method for manufacturing a capacitor. The method includes steps S21 to S23.

At S21, a lower electrode layer 2 is formed on the side wall and the bottom of a capacitive hole, the lower electrode layer 2 is manufactured by adopting the method for electrode layer manufacture in any above embodiments. That is, the lower electrode layer 2 in the embodiment includes a first electrode layer 11 and a second electrode layer 12 in the above embodiments.

At S22, a capacitive dielectric layer 3 is formed on the inside surface and the outside surface of the lower electrode layer 2.

At S23, an upper electrode layer 4 is formed on the surface of the capacitive dielectric layer 3.

Specifically, specific methods of forming the capacitive hole, forming the capacitive dielectric layer 3 on the inside surface and the outside surface of the lower electrode layer 2 and forming the upper electrode layer 4 on the surface of the capacitive dielectric layer 3 are known by those skilled in the art, and it will not be elaborated herein.

Continuously referring to FIG. 9, the disclosure further provides a capacitor. The capacitor includes a lower electrode layer 2, a capacitive dielectric layer 3 and an upper electrode layer 4.

The lower electrode layer 2 includes the electrode layer in any above embodiments. That is, the lower electrode layer 2 in the embodiment includes a first electrode layer 11 and a second electrode layer 12 in the above embodiments.

The capacitive dielectric layer 3 is located on the inside surface and the outside surface of the lower electrode layer 2.

The upper electrode layer 4 is located on the surface of the capacitive dielectric layer 3.

Figure 10:
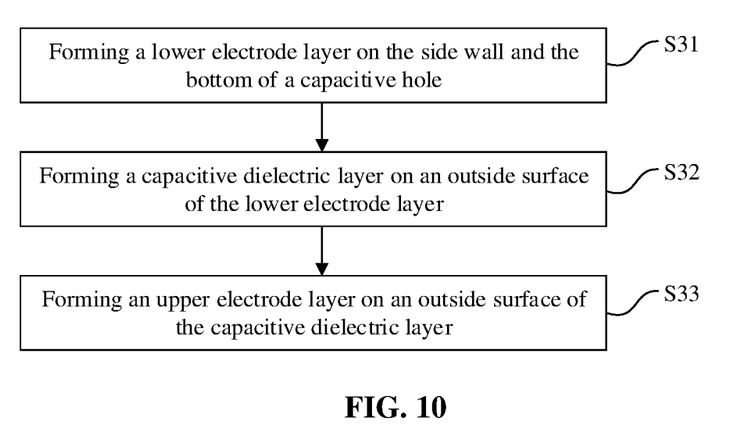
FIG. 10 is a flowchart of a method for manufacturing a capacitor provided in another embodiment of the disclosure.

Referring to FIG. 10, the disclosure further provides a method for manufacturing a capacitor. The method includes the steps S31 to S33.

At S31, a lower electrode layer 2 is formed in a capacitive hole, and the lower electrode layer 2 fully fills in the capacitive hole. The lower electrode layer 2 is manufactured by adopting the method for electrode layer manufacture in any above embodiments. That is, the lower electrode layer 2 in the embodiment includes a first electrode layer 11 and a second electrode layer 12 in the above embodiments.

At S32, a capacitive dielectric layer 3 is formed on the outside surface of the lower electrode layer 2.

At S33, an upper electrode layer 4 is formed on the outside surface of the capacitive dielectric layer 3.

Specifically, specific methods of forming the capacitive hole, forming the capacitive dielectric layer 3 on the inside surface and the outside surface of the lower electrode layer 2 and forming the upper electrode layer 4 on the surface of the capacitive dielectric layer 3 are known by those skilled in the art, and it will not be elaborated herein.

Figure 11:
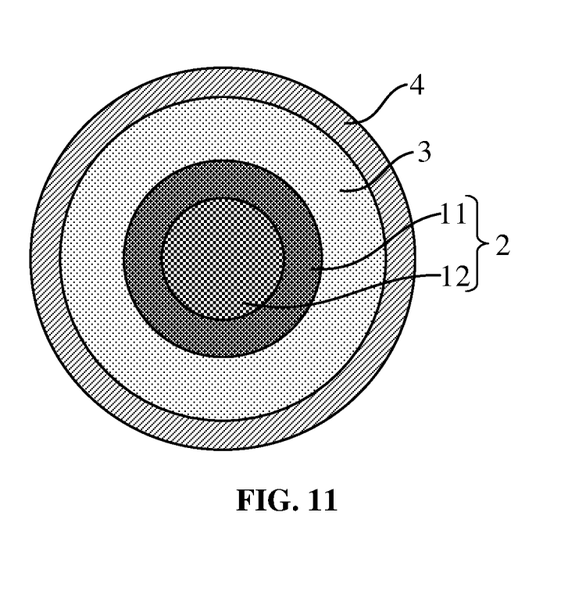
FIG. 11 is an overhead schematic structural diagram of a capacitor manufactured by the method for manufacturing the capacitor in FIG. 10.

Referring to FIG. 11, the disclosure further provides a capacitor. The capacitor includes a lower electrode layer 2, a capacitive dielectric layer 3 and an upper electrode layer 4.

The lower electrode layer 2 includes a solid columnar structure. The lower electrode layer 2 includes the electrode layer in any above embodiments. That is, the lower electrode layer 2 in the embodiment includes a first electrode layer 11 and a second electrode layer 12 in the above embodiments.

The capacitive dielectric layer 3 is located on the outside surface of the lower electrode layer 2.

The upper electrode layer 4 is located on the outside surface of the capacitive dielectric layer 3.

It should be understood that although various steps in flowcharts of FIG. 1, FIG. 3, FIG. 7, FIG. 8 and FIG. 10 are sequentially displayed by the indication of the arrows, these steps are not sequentially executed necessarily in the order indicated by the arrows. Unless expressly stated in the description, there are no strict sequence restrictions on the execution of these steps, and these steps may be executed in other order. Moreover, at least part of steps in FIG. 1, FIG. 3, FIG. 7, FIG. 8 and FIG. 10 may include multiple steps or multiple stages, these steps or stages are not executed necessarily at the same time, but may be executed at different times, and these steps or stages are not sequentially executed necessarily, and may be executed in turn or alternatively with other steps or at least part of steps or stages in other steps.

Each technical feature of the above mentioned embodiments may be combined freely. For simplicity of description, not all possible combinations of each technical solution in the above mentioned embodiments are described. However, any combination of these technical features shall fall within the scope recorded in the description without conflicting.

The above mentioned embodiments only express some implementations of the disclosure and are specifically described in detail and not thus understood as limitations to the scope of the disclosure. It should be understood that those of ordinary skilled in the art may further make multiple transformations and improvements without departing from the concept of the disclosure and all of these shall fall within the protection scope of the disclosure. Therefore, the protection scope of the disclosure should be subject to the appended claims.

The invention claimed is:

1. A method for electrode layer manufacture, comprising:
   forming a first electrode layer, the first electrode layer comprising a doped Titanium Nitride (TiN) layer; and
   forming a second electrode layer, the second electrode layer comprising a work function layer;
   wherein the second electrode layer is disposed on a surface of the first electrode layer;
   wherein the first electrode layer comprises a plurality of sub doped TiN layers superposed in sequence;
   wherein the electrode layer is a laminated structure; the electrode layer comprises a plurality of first electrode layers and a plurality of second electrode layers; and the plurality of first electrode layers and the plurality of second electrode layers in the electrode layer are superposed alternately;
   wherein after forming the second electrode layer, the method further comprises:
   forming a laminated structure comprising a plurality of first electrode layers and a plurality of second electrode layers by reperforming steps of forming the first electrode layer and forming the second electrode layer on the surface of the first electrode layer for at least one time; and
   wherein the plurality of first electrode layers and the plurality of second electrode layers in the laminated structure are laminated alternately;
   wherein the work function layer comprises a ruthenium layer or a ruthenium oxide layer; forming the second electrode layer comprises: forming the second electrode layer by adopting an atomic layer deposition process; a process of forming the second electrode layer by adopting the atomic layer deposition process comprises at least one work function growth period; and the at least one work function growth period comprises:
  forming a ruthenium precursor layer by providing a ruthenium precursor for the surface of the first electrode layer; and
  forming a sub work function layer by providing a second reaction gas for a surface of the ruthenium precursor layer.

2. The method for electrode layer manufacture of claim 1, wherein forming the first electrode layer comprises: forming the first electrode layer by adopting an atomic layer deposition process; a process of forming the first electrode layer by adopting the atomic layer deposition process comprises at least one doped TiN growth period; and the at least one doped TiN growth period comprises:
  forming a titanium precursor layer by providing a titanium precursor;
  absorbing a dopant on a surface of the titanium precursor layer by providing a dopant precursor for the surface of the titanium precursor layer; and
  forming a sub doped TiN layer by providing a first reaction gas for the surface of the titanium precursor layer absorbed with the dopant.

3. The method for electrode layer manufacture of claim 2, wherein the at least one doped TiN growth period comprises a plurality of doped TiN growth periods; at least one of before a first doped TiN growth period of the plurality of doped TiN growth periods, before a last doped TiN growth period of the plurality of doped TiN growth periods, or during at least two adjacent doped TiN growth periods of the plurality of doped TIN growth periods, the method further comprises: forming at least one TiN layer by adopting the atomic layer deposition process; and forming a first TiN layer of the at least one TiN layer by adopting the atomic deposition process comprises:
  forming the titanium precursor layer on a surface of the sub doped TiN layer by providing the titanium precursor for the surface of the sub doped TiN layer; and
  forming the first TiN layer by providing the first reaction gas for the surface of the titanium precursor layer.

4. The method for electrode layer manufacture of claim 1, wherein a dopant in the doped TiN layer comprises at least one of: silicon, boron, aluminum, zirconium, hafnium, phosphorus, carbon, gallium, germanium, antimony, tellurium, arsenic or tungsten.

5. A method for manufacturing a capacitor, comprising:
  forming a lower electrode layer on a side wall and a bottom of a capacitive hole, the lower electrode layer being manufactured by adopting the method for electrode layer manufacture of claim 1;
  forming a capacitive dielectric layer on an inside surface and an outside surface of the lower electrode layer; and
  forming an upper electrode layer on a surface of the capacitive dielectric layer.

6. The method for manufacturing a capacitor of claim 5, wherein forming the first electrode layer comprises: forming the first electrode layer by adopting an atomic layer deposition process; a process of forming the first electrode layer by adopting the atomic layer deposition process comprises at least one doped TiN growth period; and the at least one doped TiN growth period comprises:
  forming a titanium precursor layer by providing a titanium precursor;
  absorbing a dopant on a surface of the titanium precursor layer by providing a dopant precursor for the surface of the titanium precursor layer; and
  forming a sub doped TiN layer by providing a first reaction gas for the surface of the titanium precursor layer absorbed with the dopant.

7. A method for manufacturing a capacitor, comprising:
  forming a lower electrode layer in a capacitive hole, the lower electrode layer fully filling in the capacitive hole and being manufactured by adopting the method for electrode layer manufacture of claim 1;
  forming a capacitive dielectric layer on an outside surface of the lower electrode layer; and
  forming an upper electrode layer on an outside surface of the capacitive dielectric layer.

8. An electrode layer, comprising:
  a first electrode layer comprising a doped Titanium Nitride (TiN) layer; and
  a second electrode layer comprising a work function layer;
  wherein the second electrode layer is disposed on a surface of the first electrode layer;
  wherein the first electrode layer comprises a plurality of sub doped TiN layers superposed in sequence;
  wherein
  the electrode layer is a laminated structure;
  the electrode layer comprises a plurality of first electrode layers and a plurality of second electrode layers; and
  the plurality of first electrode layers and the plurality of second electrode layers in the electrode layer are superposed alternately;
  wherein the work function layer comprises a ruthenium layer or a ruthenium oxide layer.

9. The electrode layer of claim 8, wherein a first TiN layer is disposed at least one of below a sub doped TiN layer of the plurality of sub doped TiN layers in a bottom layer, below a sub doped TiN layer of the plurality of sub doped TiN layers in a top layer, or between at least two adjacent sub doped TiN layers of the plurality of sub doped TiN layers.

10. The electrode layer of claim 8, wherein the second electrode layer comprises a plurality of work function layers superposed in sequence.

11. The electrode layer of claim 8, wherein a dopant in the doped TiN layer comprises at least one of: silicon, boron, aluminum, zirconium, hafnium, phosphorus, carbon, gallium, germanium, antimony, tellurium, arsenic or tungsten.

12. A capacitor, comprising:
  a lower electrode layer comprising the electrode layer of claim 8;
  a capacitive dielectric layer located on an inside surface and an outside surface of the lower electrode layer; and
  an upper electrode layer located on a surface of the capacitive dielectric layer.

13. A capacitor, comprising:
  a lower electrode layer comprising a solid columnar structure and comprising the electrode layer of claim 8;
  a capacitive dielectric layer located on an outside surface of the lower electrode layer; and
  an upper electrode layer located on an outside surface of the capacitive dielectric layer.

* * * * *